US011302561B2

(12) United States Patent
Wang et al.

(10) Patent No.: US 11,302,561 B2
(45) Date of Patent: Apr. 12, 2022

(54) TRANSFER ELEMENTS THAT SELECTABLY HOLD AND RELEASE OBJECTS BASED ON CHANGES IN STIFFNESS

(71) Applicant: Palo Alto Research Center Incorporated, Palo Alto, CA (US)

(72) Inventors: Yunda Wang, Milpitas, CA (US); Jengping Lu, Fremont, CA (US); Qian Wang, Mountain View, CA (US); Norine E. Chang, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 73 days.

(21) Appl. No.: 16/681,215

(22) Filed: Nov. 12, 2019

(65) Prior Publication Data

US 2021/0143045 A1    May 13, 2021

(51) Int. Cl.
*H01L 21/683* (2006.01)
*H01L 25/075* (2006.01)
*H01L 33/32* (2010.01)
*H01L 33/62* (2010.01)

(52) U.S. Cl.
CPC ...... *H01L 21/6835* (2013.01); *H01L 25/0753* (2013.01); *H01L 33/32* (2013.01); *H01L 33/62* (2013.01); *H01L 2221/68322* (2013.01); *H01L 2221/68354* (2013.01); *H01L 2221/68368* (2013.01); *H01L 2933/0066* (2013.01)

(58) Field of Classification Search
None
See application file for complete search history.

(56) References Cited

U.S. PATENT DOCUMENTS

| 9,412,727 | B2 | 8/2016 | Menard et al. |
| 9,496,155 | B2 | 11/2016 | Menard et al. |
| 9,555,644 | B2 | 1/2017 | Rogers et al. |
| 9,716,085 | B2 | 7/2017 | Li et al. |
| 10,046,353 | B2 | 8/2018 | Kim et al. |
| 10,304,991 | B2 | 5/2019 | Liao |

(Continued)

FOREIGN PATENT DOCUMENTS

| EP | 3425618 | 1/2019 |
| KR | 100998087 | 12/2010 |
| WO | 2019/147589 | 8/2019 |

OTHER PUBLICATIONS

European Search Report from EP Application No. 20204793.2 dated Apr. 19, 2021, 11 pages.

(Continued)

*Primary Examiner* — Xiaoming Liu
(74) *Attorney, Agent, or Firm* — Mueting Raasch Group

(57) ABSTRACT

Transfer elements include an adhesion element having a higher Young's modulus at a lower temperature and a lower Young's modulus at a higher temperature. Heating elements are operable to change an operating temperature of each adhesion element in response to an input. A controller is coupled to provide the inputs to the heating elements to cause a change in temperature at least between the higher and lower temperature. The change in temperature causes the transfer elements to selectably hold objects to and release the objects in response to changes between the higher and lower Young's moduli of transfer elements.

22 Claims, 9 Drawing Sheets

(56) References Cited

U.S. PATENT DOCUMENTS

| | | |
|---|---|---|
| 10,533,080 B2 | 1/2020 | Kim et al. |
| 10,615,063 B2 | 4/2020 | Saketi et al. |
| 2008/0278542 A1* | 11/2008 | Anderson ............ B41J 2/14129 347/47 |
| 2010/0035049 A1* | 2/2010 | Xie ............................ C08J 7/12 428/333 |
| 2010/0047975 A1* | 2/2010 | Yeh ..................... H01L 27/1255 438/166 |
| 2010/0129986 A1 | 5/2010 | Kamiya et al. |
| 2015/0344755 A1* | 12/2015 | Schneider ................. B32B 7/06 428/164 |
| 2016/0175238 A1* | 6/2016 | Shin ........................ A61K 8/345 424/43 |
| 2016/0219702 A1* | 7/2016 | Chaji ....................... H01L 24/08 |
| 2017/0080253 A1* | 3/2017 | Clayton ............... A61N 5/1067 |
| 2017/0215280 A1 | 7/2017 | Chaji |
| 2017/0358478 A1 | 12/2017 | Thothadri et al. |
| 2018/0100046 A1 | 4/2018 | Kim et al. |
| 2018/0138357 A1 | 5/2018 | Henley |
| 2018/0261582 A1 | 9/2018 | Henry et al. |
| 2018/0294387 A1* | 10/2018 | Li ............................ H01L 24/30 |
| 2019/0393069 A1 | 12/2019 | Paranjpe et al. |
| 2020/0328198 A1 | 10/2020 | Takeya et al. |
| 2021/0111148 A1 | 4/2021 | Chen |
| 2021/0151622 A1 | 5/2021 | Ting et al. |
| 2021/0217804 A1 | 7/2021 | Takagi et al. |
| 2021/0242287 A1 | 8/2021 | Chaji et al. |

OTHER PUBLICATIONS

Eisenhaure et al., "Laser-Driven Shape Memory Effect for Transfer Printing Combining Parallelism with Individual Object Control", Advanced Materials Technologies, vol. 1, Issue 7, Aug. 11, 2016.

Kagami et al., "Shape Memory Behaviors of Crosslinked Copolymers Containing Stearyl Acrylate", Macromolecular Rapid Communications, vol. 17, Issue 8, Aug. 1996.

Matsuda et al., "Order-Disorder Transition of a Hydrogel Containing an n-Alkyl Acrylate", Macromolecules, 27, 1994, pp. 7695-7698.

Plate et al., "Structure of Crystalline Polymers with Unbranched Long Side Chains", Journal of Polymer Science Part A-1 Polymer Chemistry, vol. 9, No. 8, Aug. 1971, pp. 2291-2298.

* cited by examiner

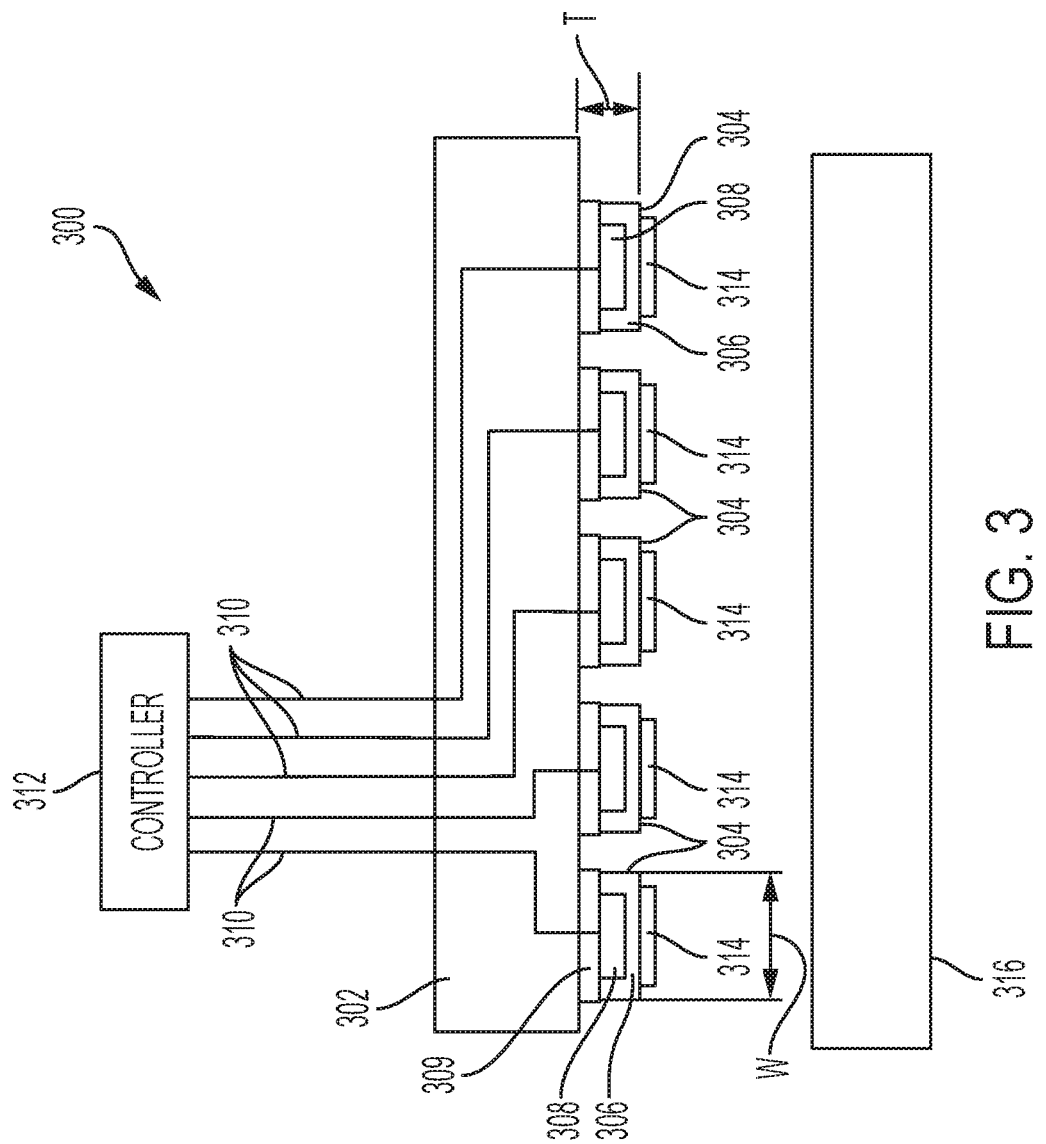

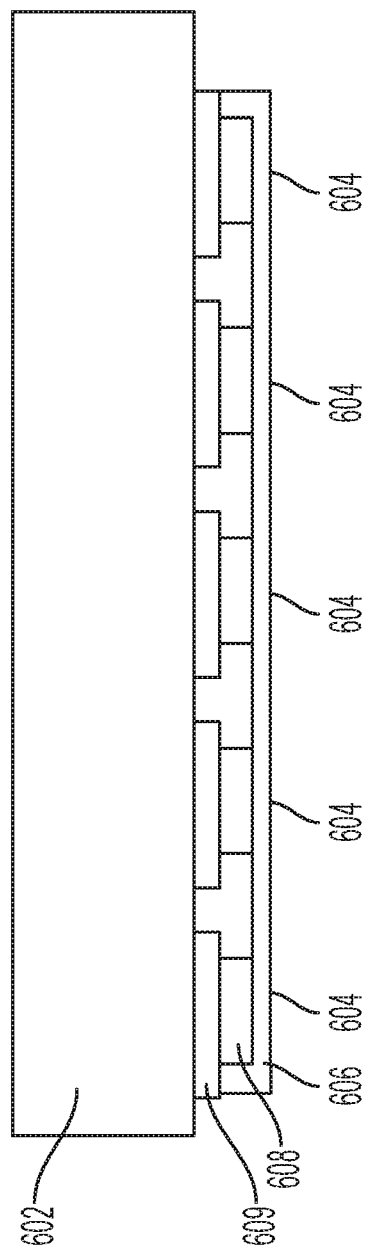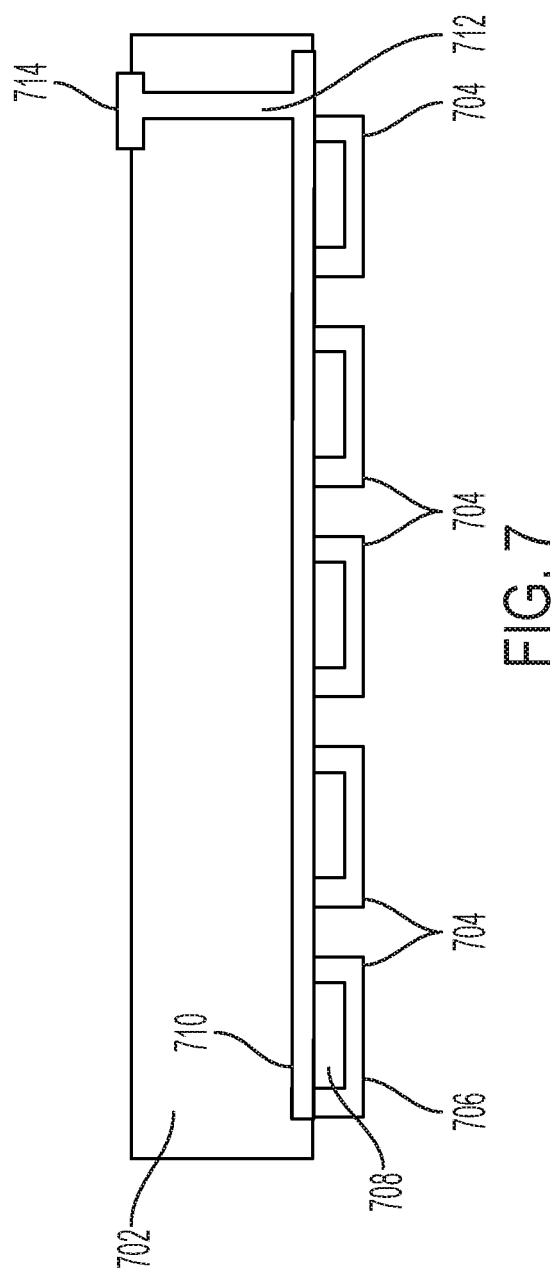

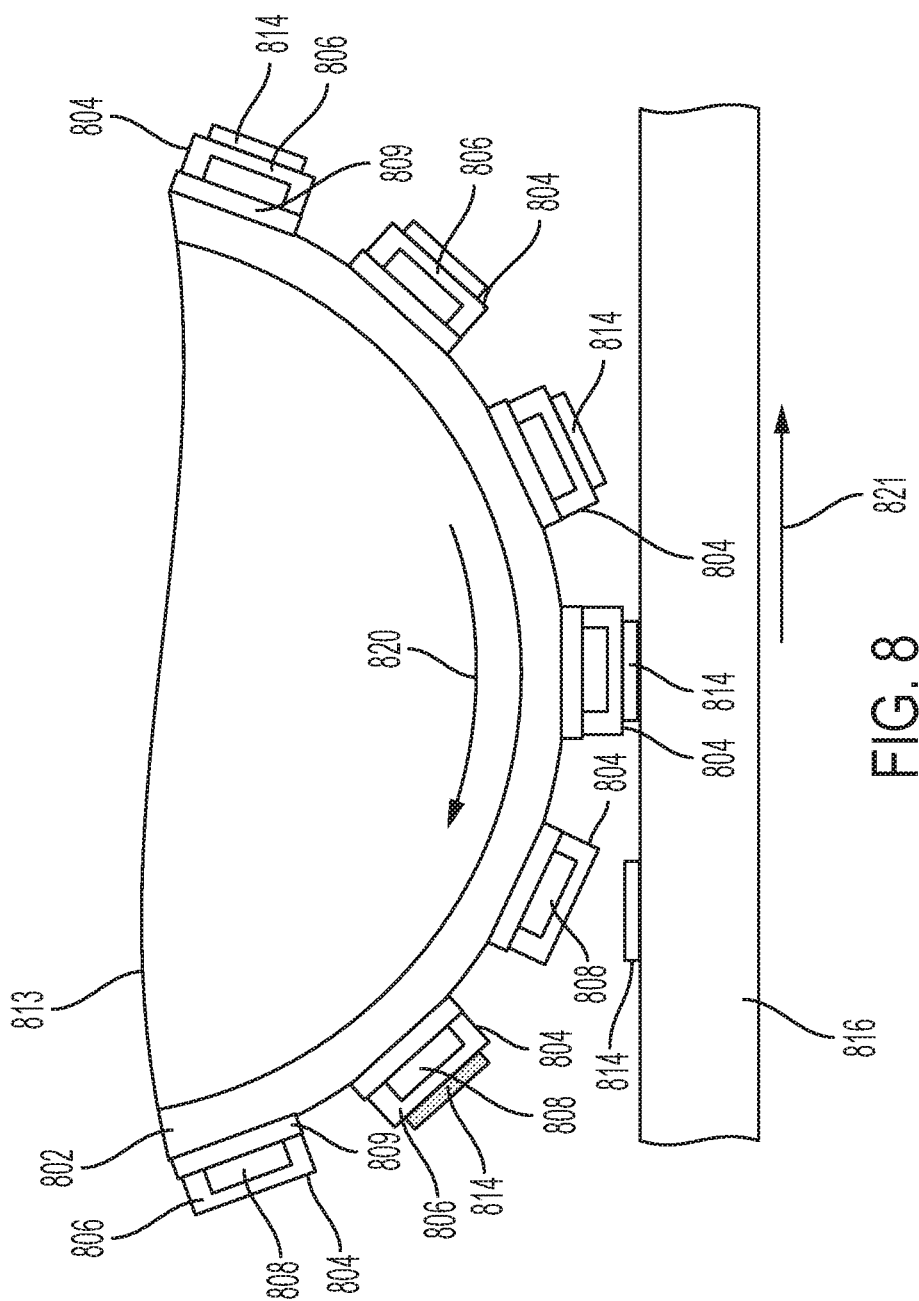

TRANSFER ELEMENTS THAT SELECTABLY HOLD AND RELEASE OBJECTS BASED ON CHANGES IN STIFFNESS

SUMMARY

The present disclosure is directed to selectable surface adhesion elements with selectable sharp rigid-to-soft transitions. In one embodiment, an apparatus includes a transfer substrate with two or more transfer elements. Each of the transfer elements includes an adhesion element having a higher Young's modulus at a lower temperature and a lower Young's modulus at a higher temperature. The apparatus includes a heating element operable to change an operating temperature of the adhesion element in response to an input. A controller is coupled to provide the inputs to the heating elements of the two or more transfer elements to cause a change in temperature at least between the higher and lower temperature. The change in temperature causes the transfer elements to selectably hold objects to and release the objects from the transfer substrate in response to changes between the higher and lower Young's moduli of transfer elements.

In another embodiment, a method involves applying first inputs to a plurality of transfer elements on a transfer substrate. Each of the plurality of transfer elements has a higher Young's modulus at a lower temperature and a lower Young's modulus at a higher temperature. The first inputs cause the subset of transfer elements to be at or above the higher temperature. The transfer elements are caused to contact a respective plurality of objects on a donor substrate at or above the higher temperature. The transfer elements are cooled to at or below the lower temperature while in contact with the plurality of objects. The transfer substrate is moved away from the donor substrate, the subset of objects adhere to the subset of transfer elements and move with the transfer substrate. The objects on the transfer substrate are caused to contact a target substrate and the subset of objects transferred from the transfer substrate to the target substrate.

In another embodiment, a system includes a donor substrate with a plurality of objects disposed on a holding layer comprising one or more of polydimethylsiloxane and silicone gel. A transfer substrate has two or more transfer elements. Each of the transfer elements includes an adhesion element having a higher Young's modulus at a lower temperature and a lower Young's modulus at a higher temperature. Each transfer element has a heating element operable to change an operating temperature of the adhesion element in response to an input. A controller is coupled to selectively provide the inputs to the heating elements of the two or more transfer elements to cause a subset of the transfer elements to selectably lift the objects from the donor substrate in response to changes at least between the higher and lower temperatures. The system includes one or more actuators configured to move one or both of the donor substrate and transfer substrate to facilitate lifting the objects from the donor substrate.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

FIG. 3 is a side view of an apparatus according to an example embodiment;

FIG. 6 is a side view of a transfer substrates according to an example embodiment;

FIGS. 7 and 8 are side views of transfer substrates according to various example embodiments;

DETAILED DESCRIPTION

Figure 2:
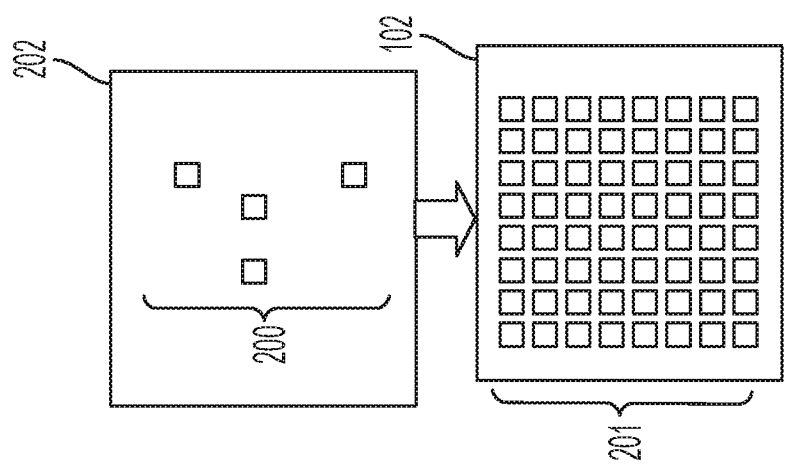
FIGS. 1 and 2 are block diagrams showing an assembly process according to an example embodiment.

The present disclosure relates to manipulation and assembly of objects, and in some embodiments the mass assembly of micro-objects via a transfer substrate. Some electronic devices are fabricated by mechanically overlaying small objects on top of each other. While micro-electronic and micro-optical components are sometimes manufactured using wafer formation techniques such as layer deposition, masking, and etching, certain classes of materials are not growth-compatible with each other. In such a case, the assembly may involve forming one class of devices on a first substrate and a second class of devices on a second substrate, and then mechanically joining them, e.g., via flip-chip or transfer printing techniques.

Aspects described herein relate to a system that is capable of transferring large number of micro objects (e.g., particles, chiplets, mini/micro-LED dies) from a donor substrate to another substrate in parallel while maintaining high position registration of the individual micro objects. This system allows selectively transferring of micro objects from a transfer substrate and selectively place the micro objects to the destination or target substrate. This system may be used for assembling devices such as microLED displays.

Generally, microLED displays are made with arrays of microscopic LEDs forming the individual transfer elements. Both OLED displays and microLED displays offer greatly reduced energy requirements compared to conventional LCD systems. Unlike OLED, microLED is based on conventional GaN LED technology, which offers higher total brightness than OLED produces, as well as higher efficiency in terms of light emitted per unit of power. It also does not suffer from the shorter lifetimes of OLED.

A single 4K television utilizing microLED has ~25 million small LED subpixels that then need to be assembled. Mass transfer of chiplets is one technology that may be used for microLED manufacturing. Transferring microLED to a target backplane quickly and accurately with a high yield will be one of the techniques that manufacturers need to perfect in order for microLED to be a viable mass-market product. The techniques described below can be used for microLED manufacture, as well as other assembly procedures in which a large number of (typically) small objects need to be moved at once, and where it may be necessary to selectively move a subset of such device to and/or from the transfer media. Such micro objects may include but not limited to inks, pre-deposited metal films, silicon chips, integrated circuit chips, beads, microLED dies, micro-electro-mechanical system (MEMS) structures, and any other pre-fabricated micro structures.

Being able to selectively transfer chiplets in an arbitrary pattern is useful to facilitate the effective transfer process, pixel repair, hole/vacancy refill for microLED display manufacturing, which will lead to high process yield. An elastomer stamp has been used to deterministically transfer microscale LED chips for this type of application. However, an elastomer stamp has fixed pattern and cannot transfer arbitrary pattern of chiplets. Inevitably, some subset of the chiplets will be defective, and therefore it becomes difficult to replace a select few of them using such a stamp.

Figure 1:
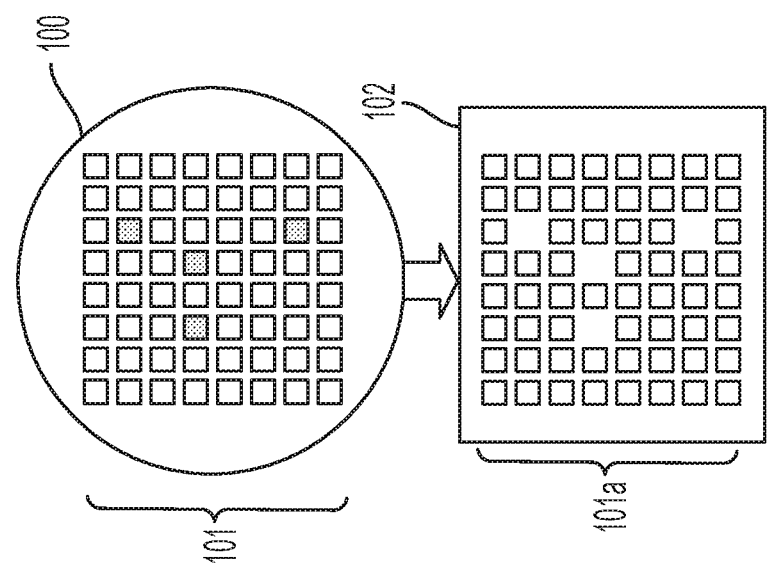

In FIGS. 1 and 2, block diagrams show an example of an assembly process that can be achieved using devices, systems, and methods according to an example embodiment. In FIG. 1, a donor wafer/substrate 100 is shown that includes an array of chiplets 101 that may have been grown or placed on the substrate 100. The shaded chiplets in the array 101 have been identified as defective, and when the chiplets are transferred to a target substrate 102, only a subset 101a of the chiplet array are transferred, namely the good chiplets that are not shaded. This may be achieved with a transfer substrate 200 as shown in FIG. 2 that can selectively pick up just the subset 101a from the donor substrate 100 once they are identified. As shown in FIG. 2, the transfer substrate 202 subsequently picks up a second set of chiplets 200 (e.g., from a different donor substrate). The locations of the chiplets within the set 200 correspond to the locations of the defective chiplets on the first donor substrate 100. The transfer substrate 202 moves this set 200 to the target substrate 102, resulting in a full set 201 of operational chiplets being located on the target substrate 102.

The present disclosure relates to, among other things, a transfer substrate with a set of transfer elements (e.g., transfer pixels) that can selectively hold a subset of micro objects. Thus, even when all of the transfer elements are in contact with an array of micro objects that is greater than the subset, only the subset will be adhere and be transferred, and the objects outside the subset will be left behind or otherwise unaffected. Similarly, the transfer substrate may be able to selectively release a subset of micro objects that are currently attached to the substrate, such that only the subset is transferred to a target even all of the transfer elements are currently holding a micro object. This process is repeatable and reversible, such that no permanent bonding is need to affect the selective holding or releasing of the objects.

In FIG. 3, a side view illustrates details of an apparatus 300 according to an example embodiment. The apparatus includes a transfer substrate 302 with two or more transfer elements 304. The transfer elements 304 can selectively made to change stiffness, which can be expressed as the Young's modulus of the material from which the elements are made. The Young's modulus is a measure of stress (force per unit area) divided by strain (proportional deformation) in a material in the linear elasticity regime. Generally, materials with higher Young's modulus (lower strain for a stress a) is stiffer than a material with lower Young's modules (higher strain for the same a). Other measures may also be used to represent stiffness of a material, such as storage modulus, which also accounts for dynamic performance of the material. Some measures may be used to represent stiffness of a part, such as a spring constant, that may be functionally equivalent in defining performance of the part. However the stiffness is defined, the transfer elements 304 have a change in stiffness in response to temperature that can be utilized in device transfer as described below.

Each of the transfer elements 304 includes an adhesion element 306 having a higher Young's modulus >6 MPa at a lower temperature and a lower Young's modulus <1 MPa at a higher temperature. Each of the transfer elements 304 also includes a thermal element 308 operable to change a temperature of the adhesion element 306 in response to an input, e.g., via inputs 310. A controller 312 is coupled to provide the inputs 310 to the thermal elements 308, thereby causing a subset of the transfer elements 304 to selectably pick up and hold objects 314 to and (optionally) release the objects 314 from the transfer substrate 302. In particular, the objects 314 will not stick to the transfer elements 304 at the lower temperature but will stick at the higher temperature. To increase the reliability of the adhesion, the transfer elements may be cooled before attempting to pull the objects 314 away from transfer substrate 302.

The apparatus 300 may be part of a micro-transfer system, which is a system used to transfer micro-objects (e.g., 1 µm to 1 mm) from the transfer substrate 302 to a target substrate 316. The adhesion element 306 may be formed of a multi-polymer that contains stearyl acrylate-based (SA). In such a case, a difference between the higher and lower temperatures may be less than 20° C. (or in other cases less than 50° C.) in order to adjust the tackiness of the adhesion element 306 such that there is a marked difference in surface adhesion and Young's modulus, e.g., from <1 MPa at the higher temperature to >6 MPa at the higher temperature. The controller 312 in such a system may be coupled to actuators that induce relative motion between substrates to facilitate object transfer as described herein.

The thermal element 308 may include one or both of a heating element and a cooling element. The inputs 310 may include electrical signals and/or laser light. The inputs 310 may be configured (e.g., using a matrix circuit) such that there are fewer lines going to the controller 312 than the total number of transfer elements 304. The transfer elements 304 may further include a thermal insulator 309 between the adhesion element 306 and the transfer substrate 302. The insulator 309 helps prevent heat transfer to the substrate 302, thereby decreasing the amount of energy needed to affect temperature change at the adhesion element 306 and decrease response time.

Generally, the transfer elements 304 form an intermediate transfer surface whose compliance can be modulated (e.g., have a sharp rigid-to-soft transition) as a function of temperature. Such a surface can be used to pick up and release groups of micro-objects in a controlled and selectable manner. Each transfer element 304 may have lateral dimensions W from several micrometers to several hundreds of micrometers. Each transfer element 304 may have a total thickness T from less than one micron to several hundred microns. The pitch of the transfer array may vary from several microns to several millimeters. In some embodiment, the thermal elements 308 and insulating layers 309 are continuous layers that are not physically isolated from one another. As such, the transfer element "pixel" is the region where the heating/cooling elements can be individually addressed and controlled (see FIG. 6). The substrate 302 material may include but is not limited to glass, quartz, silicon, polymer and silicon carbide (SiC). The substrate 302 may have a thickness ranges from several tens of microns to several millimeters and lateral dimensions from several millimeters to one meter.

Note that, while the illustrated embodiments show two or more transfer elements 304, in some cases a single transfer element may be used. For example, a single transfer element 304 may be part of a manipulator that is placed at the end of a robotic arm. In such a configuration, a single transfer element 304 may be used to pick up objects without requiring the use of pincers, vacuum, magnetics, etc. In other configurations, one or more transfer elements may be placed at the ends of pincers or other holding appendages to assist in gripping without having to apply undue pressure on the object being held. As with the other embodiments, a thermal element can increase change adhesion (corresponding to a change in Young's modulus) during holding and releasing operations.

Phase-changing polymer comprising stearyl acrylate (SA) has been studied as a bistable electroactive polymer (BSEP) for use in the adhesion element. The BSEP polymer is a rigid polymer below its glass transition temperature (Tg). Above Tg, it becomes an elastomer that exhibits large elongation at break and high dielectric field strength. Electrical actuation can be carried out above Tg with the rubbery BSEP functioning as a dielectric elastomer. The deformation is locked when cooling down the polymer below Tg. The shape change can be reversed when the polymer is reheated above Tg.

Stearyl acrylate (octadecyl acrylate, SA) based polymers have been investigated as shape memory polymers due to their sharp phase transition between the crystalline and molten states of the stearyl moieties. The abrupt and reversible phase transition of the crystalline aggregates of the stearyl moieties results in a rapid shift between the rigid and rubbery states of the polymers during temperature cycles. The transition of SA is typically below 50° C. with a narrow phase change temperature range of less than 20° C. Therefore, SA is an ideal component for imparting a sharp rigid-to-rubbery transition. Some preliminary experiments have been done to validate this characteristic.

The adhesion element 306 may be made of materials including but not limited to stearyl acrylate (octadecyl acrylate, SA) based polymers, stearyl acrylate and urethane diacrylate copolymer or other types of polymers. In particular, a copolymer containing urethane diacrylate and SA has been found to have desirable characteristics for these purposes. The adhesion element 306 preferably has a sharp rigid-to-soft transition therefore the adhesion can be easily modulated with temperature change. The thermal elements 308 could be thermoelectric heating/cooling elements, resistive heaters, diode heaters, inductive heating elements, an optical heating elements, etc. The thermal elements 308 may include thin film resistors, a diode structure, and/or high optical energy absorbing efficiency materials such as carbon black, carbon nanotubes, engineered nanoparticles, etc. The thermal insulator 309 may be made from materials such as polyimide, PDMS, parylene, glass, silicon oxide, $Al_xO_y$, and SxNy, and combinations thereof.

Figure 4:
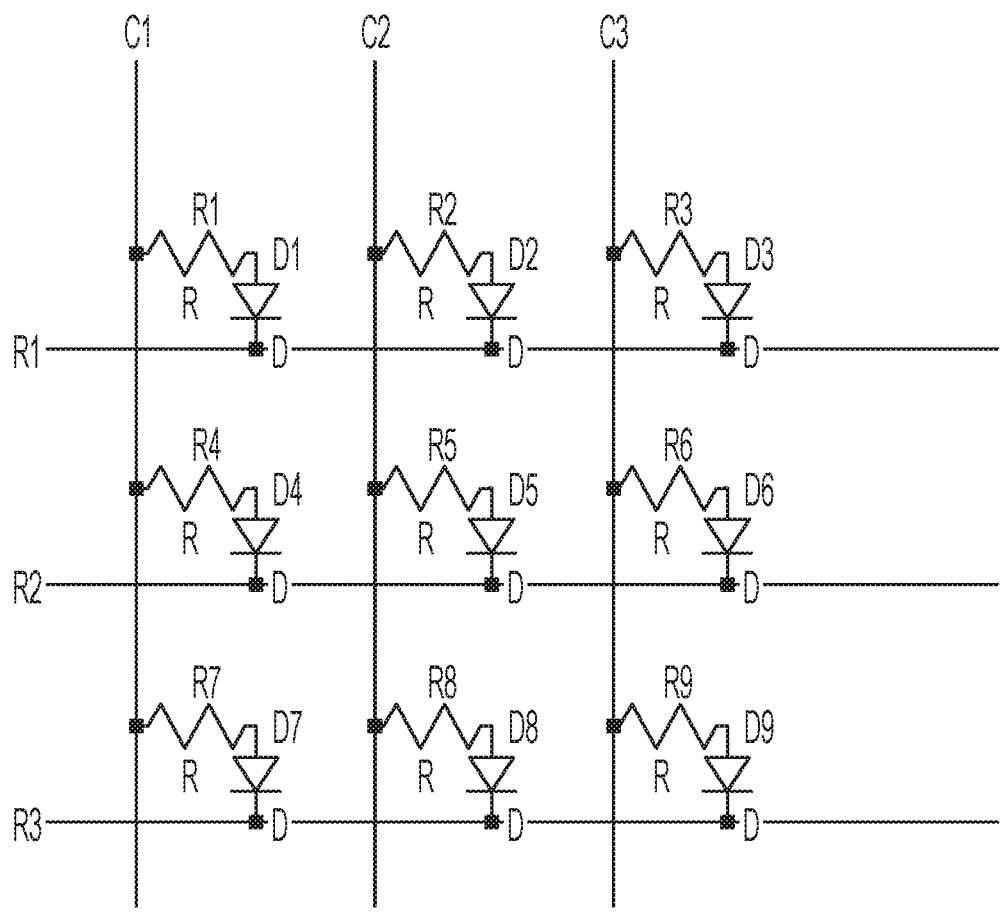
FIGS. 4 and 5 are schematic diagrams of switching matrices for a transfer substrate according to example embodiments.
Figure 5:
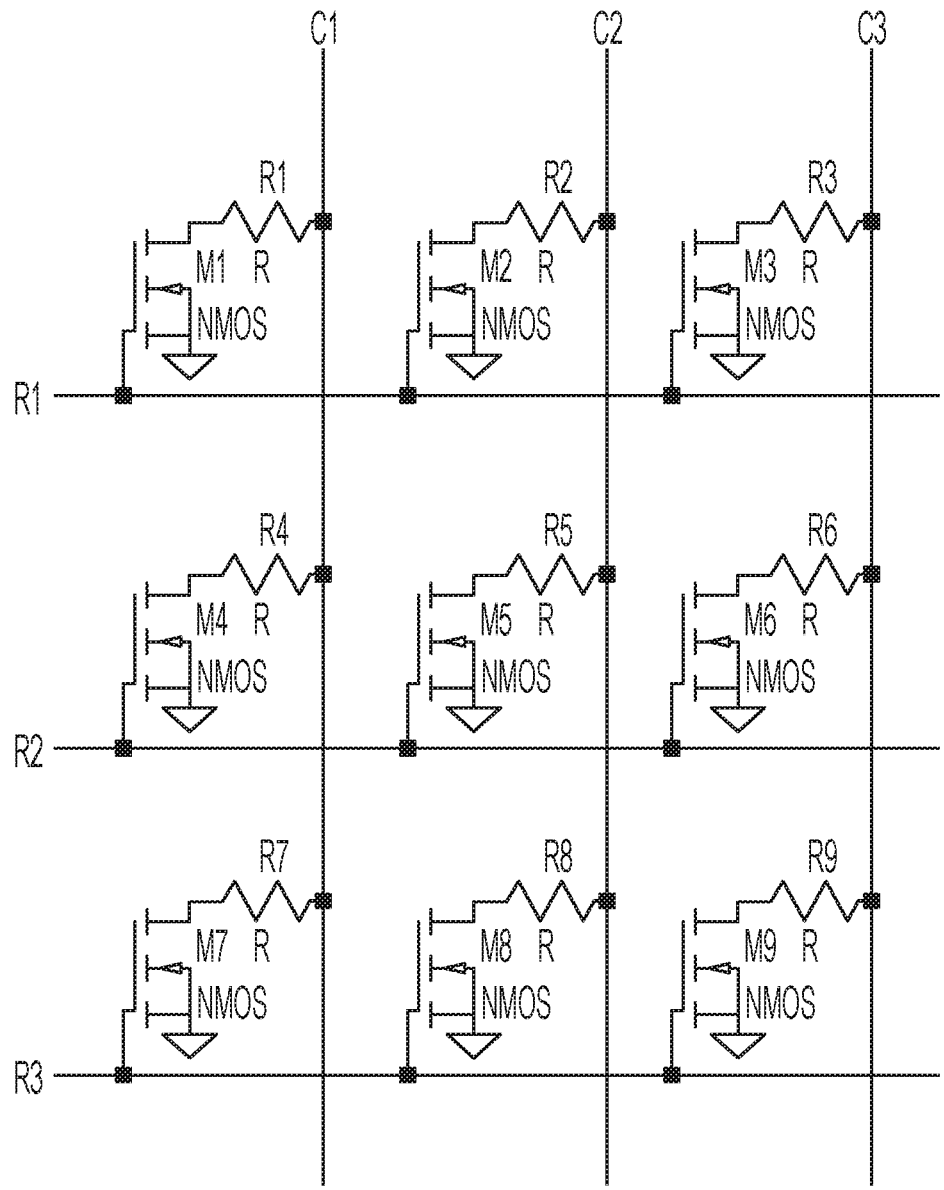

In one embodiment, the transfer substrate 302 contains an active electronics components array and the thermal elements 308 may be interconnected with them in a grid. This is shown schematically shown in FIGS. 4 and 5. The 2D array of thermal elements (resistors in these examples) can be controlled by a diode as shown in FIG. 4 or a transistor as shown in FIG. 5. In the embodiment shown in FIG. 4, heating elements R1-R9 are controlled by a matrix of diodes D1-D9. This may be referred to as passive switching matrix, which reduces the number of electrical wires needed to connect the heating elements to controller chip.

In this case, the heating elements are addressed row-by-row. For example, R1 can be biased to 0V, while R2 and R3 are biased to 5V. The C1, C2 and C3 bias voltages will determine if the heating elements R1, R2 or R3 is turned on (column is biased to 5V) or off (column line is biased to 0V). All the other heaters are off because of diodes blocking the current flow. The process is repeated for all the rest of rows for selected row is biased to 0V and all the other rows biased to 5V. The thermal time constant of thermal elements will be designed to be longer than the "frame rate" of the 2D scanning to ensure quasi constant temperature is maintained for each addressable transfer.

The schematic diagram in FIG. 5 shows another circuit where the thermal elements are controlled by transistors (e.g., thin film transistors, or TFTs) instead of diode, which may be referred to as "active matrix switching." Each thermal element has at least one end connected to a drain or a source of one of the TFTs. The advantage of using transistors is that larger voltage range and better isolation can be achieved. In this case, all the rows not selected will be biased to, e.g. −5V, to turn off transistors. When a row is selected, the row line is biased to, e.g. 20V, to turn on the transistors. Biasing the column line to the specific voltage enables the corresponding heating element of the selected row to be heated to the desired temperature. Similar to the embodiment in FIG. 4, the process will be repeated for the rest of the other rows.

In FIG. 6, a side view shows a transfer substrate 602 according to another example embodiment. As with the embodiment in FIG. 3, the transfer substrate 602 has two or more transfer elements 604 each including an adhesion element 606 having a surface adhesion that varies by temperature. Each of the transfer elements 604 also includes a thermal element 608 operable to change a temperature of the regional adhesion element 606 (e.g., part of element near thermal element 608) in response to an input. In this example, the adhesion element 604 is part of a continuous layer that covers more than one transfer element 604, in this case, all of the illustrated elements 604. Any of the embodiments described herein may use an adhesion element formed of a single layer that covers a plurality of element similar to what is shown in FIG. 6.

Also note that this embodiment shows the use of an insulator 609 between the transfer elements 604 and the substrate 602, although such insulators 609 may be optional. Also, as indicated by dashed lines, one or both of the thermal elements 608 and insulator 609 may be implemented as a single layer that covers more than one transfer element 604. In such an embodiment, individual signal lines (e.g., lines 310 in FIG. 3 and/or waveguides 1112 in FIG. 7) may be attached to the thermal element layer 608, such that local temperature change is induced within a region that defines the size and location of the individual transfer element 608.

In FIG. 7, a side view shows a transfer substrate 702 according to another example embodiment. As with the embodiment in FIG. 3, the transfer substrate 702 has two or more transfer elements 704 each including an adhesion element 706 having a surface adhesion that varies by temperature. Each of the transfer elements 704 also includes a thermal element 708 operable to change a temperature of the adhesion element 706 in response to an input. In this example, the thermal elements 708 are activated by laser light 710 which is delivered via waveguides 712 in the substrate 702. The light is provided from one or more lasers 716 and may selectively activate the transfer elements 704 via optical switching elements 714 that absorb or redirect light away from transfer elements that are not to be heated. Note that multiple lasers 716 may be used, as many as one per transfer element and they may be integrated in the substrate 702 or mounted externally. The optical switches 714 may be electrically activated and may be arranged in a matrix similar to the diodes and transistors shown in FIGS. 4 and 5 to reduce the number of lines to the controller.

In FIG. 8, a side view shows a transfer substrate 802 according to another example embodiment. As with the embodiment in FIG. 3, the transfer substrate 802 has two or more transfer elements 804 each including an adhesion element 806 having a surface adhesion that varies by temperature. Each of the transfer elements 804 also includes a thermal element 808 operable to change a temperature of the adhesion element 806 in response to an input. Each of the transfer elements 804 also includes an insulator 809 that thermally insulates the thermal element 808 from the transfer substrate 802.

In this embodiment, the transfer substrate 802 is curved and mounted to a roller 813 that rotates relative to a target substrate 816. The roller 813 and target substrate also move linearly relative to one another (horizontally in this illustration) such that only a subset of the transfer elements 804 (e.g., a single element 804) contacts the transfer substrate 816 at a time. The subset of transfer elements 804 are selectively activated to hold or release an object 814, such that some of the objects 814 are selectively transferred to the target substrate 816. Note that the shaded object 814 to the left was not transferred to the target substrate 816. Note another part of the roller 813 and substrate 802 may be in contact with a donor substrate (not shown) such that the transfer of objects may be a rolling transfer process where objects 814 are picked up from the donor and transferred to the target 816.

The roller 813 and substrate 802 may be in contact with the donor and target substrates at the same times, or different times. In such a case, a second transfer substrate (not shown) may be used to deposit discarded objects 814, and this second transfer substrate may also use a curved substrate. Any of the other embodiments described herein may use a curved transfer substrate and rolling transfer process as shown in FIG. 8. As indicated by arrows 820, 821, the transfer may be facilitated by a rotational actuator 820 that rotates the roller 813 and a linear actuator 821 that induces relative linear motion between the roller 813 and the substrate 802.

Figure 9A:
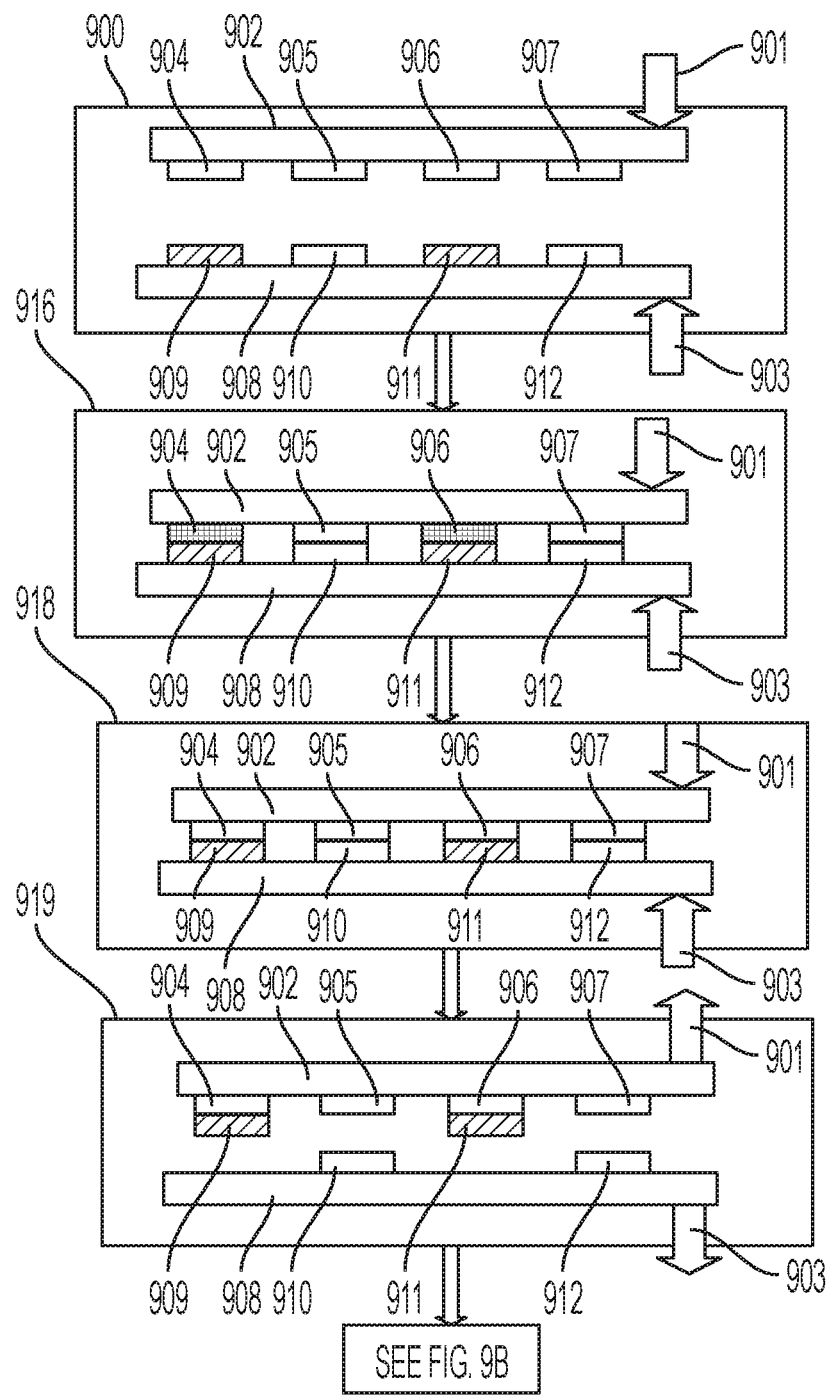
FIGS. 9A and 9B are diagrams of a method according to an example embodiment.
Figure 9B:
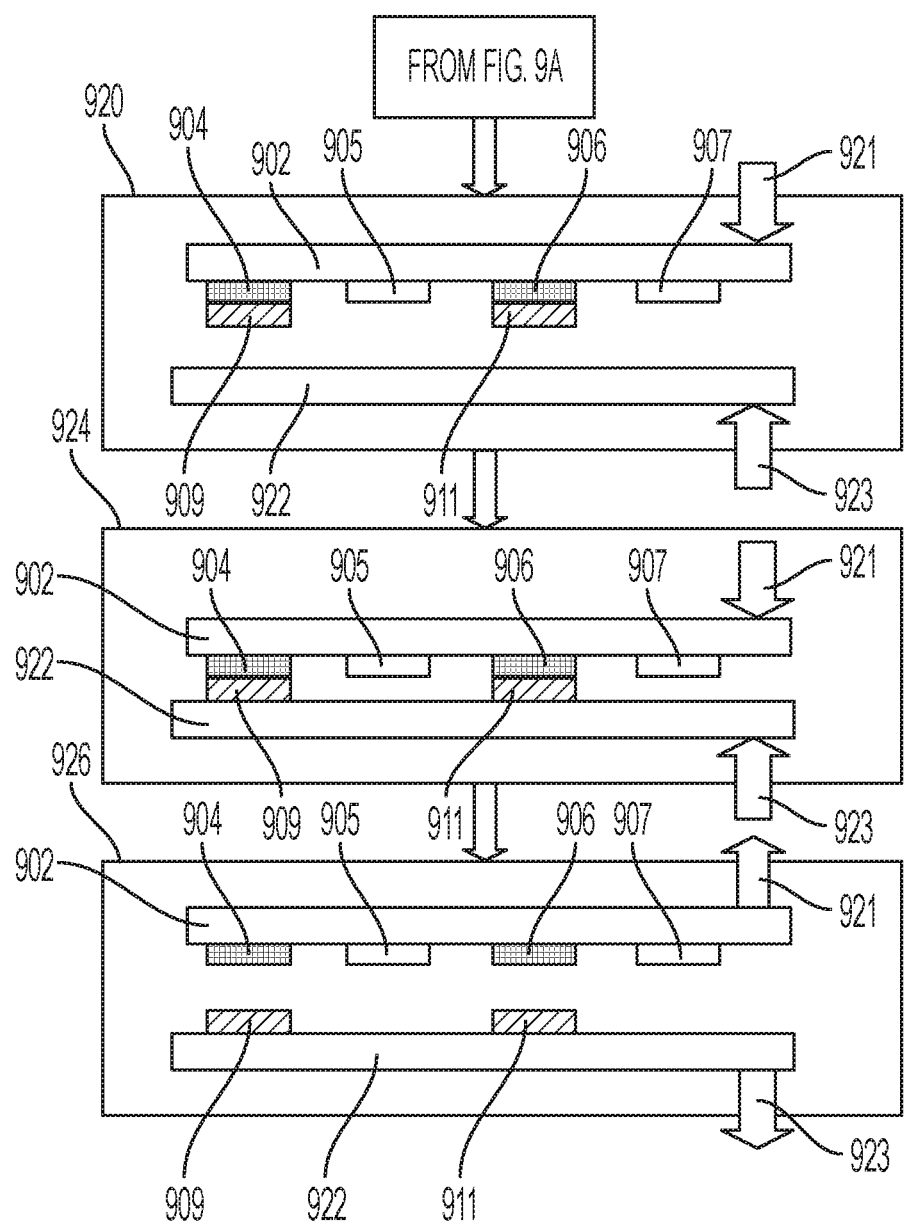

In FIGS. 9A and 9B, a block diagram shows a method according to an example embodiment. In block 900, a transfer substrate 902 is shown having an array of transfer elements 904-907. The transfer substrate 902 is shown positioned over a donor substrate 908 such that the array of transfer elements 904-907 is aligned over respective objects 909-912. As indicated by the shading, the objects 909, 911 form a subset of the objects 909-912 that is intended to be transferred off the donor substrate 908. The transfer substrate 902 is moved towards the donor substrate 908, or vice versa. This movement may be accomplished via one or more mechanical actuators 901, 903 that induce relative motion between the substrates 902, 908.

As seen in block 916, when contact is made between the transfer elements 904-907 and objects 909-912, electrical inputs have been applied to a subset of the transfer elements 904, 906 as indicated by the shading of elements 904, 906. The inputs cause each transfer element 904, 906 in the subset to be at or above a high temperature (e.g., between 30° C. and 65° C.) such that an adhesion element of each transfer element 904, 906 in the subset achieves a lower Young's modulus (e.g., <1 MPa). This input may be applied before or after the subset of transfer elements 904, 906 contact the respective subset of objects 909, 911. The subset of objects 909, 911 are attracted to (e.g., due to increased van der Waals forces at the lower Young's modulus) to the subset of the transfer elements 904, 906 that are at the lower Young's modulus that correspond to the higher temperature range. The actuators 902, 903 may be configured to apply pressure during this operation Note that other transfer elements 905, 907 that are not in the subset of transfer elements 904, 906 may be at or below a lower temperature (e.g., between 0° C. and 30° C.) that results in transfer elements 905, 907 having a higher Young's modulus (e.g., >6 MPa, and in some cases >10 MPa). At this second Young's modulus, the other transfer elements 905, 907 will not be attracted to respective objects 910, 912, e.g., due to low van der Waals forces. Note that in the previous step shown in block 900, the transfer elements 904-907 may be at any temperature.

As seen in block 918, the subset of transfer elements 904, 906 has been set at or below the lower temperature while still in keep in good contact with the subsets of objects 909, 911 that will be transferred off the substrate 908. It has been found that this can increase attraction between the transfer elements 904, 906 and objects 909, 911. This attraction may be further enhanced by adding protrusions to the objects 909, 911 that extend from a surface of the objects 909, 911 that face the transfer elements 904.

As seen in block 919, the transfer substrate 902 is moved away from the donor substrate by one or more of the actuators 901, 903, causing the subset of objects 909, 911 to be separated from the donor substrate 908 while the other objects 910, 912 remain on the donor substrate. As seen in block 920 in FIG. 9B, the transfer substrate 902 is aligned with and moved towards a target substrate 922 by actuators 921, 923, which may be the same or different than actuators 901, 903 in FIG. 9A. As seen in block 924, the subset of objects 909, 911 on the transfer substrate 902 contact the target substrate 922.

Optionally, in one or both of blocks 924, 926, second inputs may be applied to the subset of transfer elements 904, 906 causing each transfer element in the subset to achieve or go beyond the higher temperature. There may be an inherent or actively generated attraction between the subset of objects 909, 911 and the target substrate 922 such that the objects 909, 911 may release at the higher temperature or lower temperature. For example, a counter force may be applied from the target substrate 922 that includes but not limited to adhesive force, electrical force, magnetic force, and a vacuum-created force.

Figure 10:
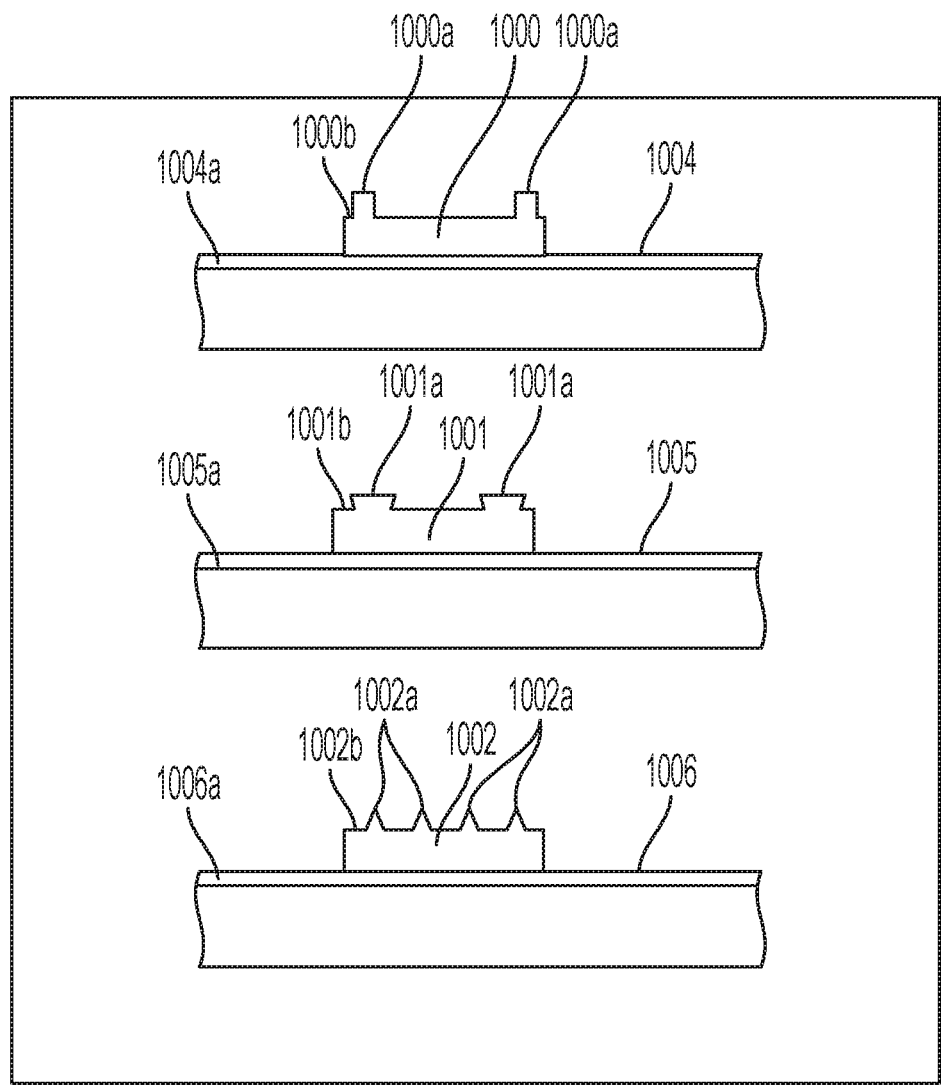
FIG. 10 is a diagram showing protrusions on transferable objects according to example embodiments.

As noted above, the transferred objects may include features that increase the adhesion at the time of removal from the donor substrate. In FIG. 10, diagrams illustrate features of objects 1000-1002 according to example embodiments. The objects 1000-1002 are shown on respective substrates 1004-1006. Each of the objects 1000-1002 each have one or more respective protrusions 1000a-1002a extending above planar surfaces 1000b-1002b. As shown, the protrusions may include posts, pyramid, trapezoids, and may include any other type of protruding structure, such as hooks loops, bumps, etc. The highest point of the protrusions 1000a-1002a may be between 1 μm and 20 μm above the planar surfaces 1000b-1002b. The protrusions 1000a-1002a can be made of the same or different materials than that of the objects 1000-1002, such as silicon, GaN, SiO2, SiN, metal, SU8, polyimide or other polymer.

The substrates 1004-1006 may be donor substrates that have holding layers 1004a-1006a configured to temporarily hold the objects 1000-1002. The temporary holding layers 1004a-1006a may include an elastomer material such as polydimethylsiloxane (PDMS), silicone gel, etc., and may have a Young's modulus <2 MPa. The thickness of the layers 1004a-1006a may range from 1 μm to 100 μm.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. An apparatus, comprising:
  a transfer substrate, comprising two or more transfer elements, each of the transfer elements comprising:
    an adhesion element having a higher Young's modulus at a lower temperature and a lower Young's modulus at a higher temperature, wherein the adhesion element comprises stearyl acrylate;
    a heating element operable to change an operating temperature of the adhesion element in response to an input; and
  a controller coupled to provide the inputs to each heating element of the two or more transfer elements to cause a change in temperature at least between the higher and lower temperature, the change in temperature causing the transfer elements to selectably hold objects to and release the objects from the transfer substrate in response to changes between the higher and lower Young's moduli of the two or more transfer elements, wherein the selectable holding and releasing of the objects by the transfer elements is repeatable and reversible.

2. The apparatus of claim 1, wherein the transfer substrate comprises one or more of glass and silicon carbide.

3. The apparatus of claim 1, wherein the objects comprise sub-millimeter electronic devices.

4. The apparatus of claim 1, wherein the adhesion element is formed of a copolymer containing urethane diacrylate and the stearyl acrylate.

5. The apparatus of claim 1, wherein the heating element comprises a resistive heating element.

6. The apparatus of claim 1, further comprising a plurality of active electronic components coupled to the controller and configured to independently activate respective ones of the heating elements.

7. The apparatus of claim 6, wherein the active electronic components comprise diodes, each heating element having at least one end connected to one of the diodes.

8. The apparatus of claim 6, wherein the active electronic components comprise thin film transistors, each heating element having at least one end connected to a drain or a source of one of the thin film transistors.

9. The apparatus of claim 1, wherein the objects comprise GaN micro-light emitting diode (LED) chips having a planar surface facing the transfer substrate.

10. The apparatus of claim 9, wherein the GaN micro-LED chips comprise protrusions extending above the planar surface.

11. The apparatus of claim 10, wherein a highest point of the protrusions is between 1 um and 20 um above the planar surface.

12. The apparatus of claim 10, wherein the protrusions are made of at least one of silicon, GaN, SiO2, SiN, metal, SU8, polyimide or other polymer.

13. A method comprising:
  applying first inputs to a plurality of transfer elements on a transfer substrate, each of the plurality of transfer elements having a higher Young's modulus at a lower temperature and a lower Young's modulus at a higher temperature, the first inputs causing the plurality of transfer elements to be at or above the higher temperature, wherein the transfer elements are formed of stearyl acrylate;
  causing the plurality of transfer elements to contact a respective plurality of objects on a donor substrate at or above the higher temperature;
  cooling the plurality of the transfer elements to at or below the lower temperature while in contact with the plurality of objects causing the plurality of transfer elements to hold the respective plurality of objects;
  moving one or both of the donor substrate and the transfer substrate to facilitate lifting the plurality of objects from the donor substrate;
  causing the plurality of objects on the transfer substrate to contact a target substrate; and
  heating the plurality of the transfer elements to the higher temperature to release the plurality of objects and transfer the plurality of objects from the transfer substrate to the target substrate, wherein the holding and releasing of the objects by the plurality of the transfer elements is repeatable and reversible.

14. The method of claim 13, wherein causing the transfer elements to contact the objects comprises causing a second plurality of transfer elements on the transfer substrate to contact a second plurality of objects on the donor substrate while the second plurality of transfer elements are below the higher temperature such that the second plurality of objects do not adhere to the transfer substrate and do not move with the transfer substrate.

15. The method of claim 13, wherein the higher temperature is between 30° C. and 65° C., and the lower temperature is between 0° C. and 30° C., the higher and lower temperatures associated with a phase change temperature range between the higher Young's modulus and the lower Young's modulus that is less than 20° C..

16. The method of claim 13, wherein the objects comprise GaN micro-light emitting diode (LED) chips having a planar surface facing the transfer substrate.

17. The method of claim 16, wherein the GaN micro-LED chips comprise one or more protrusions extending above the planar surface and wherein a highest point of the protrusions is between 1 um and 20 um above the planar surface.

18. The method of claim 17, wherein the protrusions are made of at least one of silicon, GaN, SiO2, SiN, metal, SU8, polyimide or other polymer.

19. An apparatus, comprising:
- a transfer substrate, comprising two or more transfer elements, each of the transfer elements comprising:
  - an adhesion element having a higher Young's modulus at a lower temperature and a lower Young's modulus at a higher temperature, a transition between the lower temperature and the higher temperature occurring below 50° C. and a phase change temperature range associated with the higher and lower temperatures being less than 20° C.; and
  - a heating element operable to change an operating temperature of the adhesion element in response to an input;
- a controller coupled to selectively provide the inputs to the heating elements of the two or more transfer elements to cause a subset of the transfer elements to selectably hold and lift a corresponding subset of objects from a donor substrate in response to changes at least between the higher and lower temperatures;
- one or more actuators configured to move one or both of the donor substrate and transfer substrate to facilitate lifting the subset of objects from the donor substrate and cause the subset of objects on the transfer substrate to contact a target substrate; and
- the controller heating the subset of the transfer elements to the higher temperature to release the subset of objects and transfer the subset of objects from the transfer substrate to the target substrate, wherein the selectable holding and releasing of the subset of objects by the subset of transfer elements is repeatable and reversible.

20. The apparatus of claim 19, wherein the subset of objects are disposed on a holding layer comprising one or more materials having a Young's modulus <2 MPa, wherein the holding layer is made of at least one of polydimethylsiloxane and silicone gel and has a thickness from 1 µm to 100 µm.

21. The apparatus of claim 19, wherein the higher Young's modulus is >6 MPa at the lower temperature and the lower Young's modulus is <1 MPa at the higher temperature.

22. The apparatus of claim 19, wherein the adhesion element is formed of a copolymer containing at least one of urethane diacrylate, stearyl acrylate, poly(norbornene), poly(urethane) and poly(styrene-butadiene).

* * * * *